United States Patent [19]
Feldman et al.

[11] Patent Number: 6,128,134
[45] Date of Patent: Oct. 3, 2000

[54] INTEGRATED BEAM SHAPER AND USE THEREOF

[75] Inventors: Michael R. Feldman; Alan D. Kathman; W. Hudson Welch; Robert TeKolste, all of Charlotte, N.C.

[73] Assignee: Digital Optics Corporation, Charlotte, N.C.

[21] Appl. No.: 08/917,865

[22] Filed: Aug. 27, 1997

[51] Int. Cl.[7] .............................. G02B 6/12; G02B 27/30
[52] U.S. Cl. ........................ 359/565; 359/16; 359/19; 359/558; 359/641; 385/14
[58] Field of Search ............................ 385/14; 359/15, 359/16, 19, 558, 565, 641

[56] References Cited

U.S. PATENT DOCUMENTS

| | | | |
|---|---|---|---|
| 4,813,762 | 3/1989 | Leger et al. | 359/565 |
| 5,056,881 | 10/1991 | Bowen et al. | 385/14 |
| 5,061,025 | 10/1991 | Debesis | 359/569 |
| 5,111,343 | 5/1992 | Harrigan | 359/888 |
| 5,161,059 | 11/1992 | Swanson et al. | 359/565 |
| 5,214,535 | 5/1993 | Harris et al. | 359/565 |
| 5,237,434 | 8/1993 | Feldman et al. | 385/14 |
| 5,237,451 | 8/1993 | Saxe | 359/565 |
| 5,422,746 | 6/1995 | Aharoni et al. | 359/15 |
| 5,465,265 | 11/1995 | Ota | 372/101 |
| 5,499,262 | 3/1996 | Nakata | 372/108 |
| 5,504,350 | 4/1996 | Ortyn | 257/81 |
| 5,568,574 | 10/1996 | Tanguay, Jr. et al. | 385/14 |
| 5,583,843 | 12/1996 | Horinouchi | 369/112 |
| 5,638,469 | 6/1997 | Feldman et al. | 385/14 |
| 5,703,861 | 12/1997 | Matsuda | 369/110 |
| 5,712,841 | 1/1998 | Opheij et al. | 369/112 |
| 5,727,009 | 3/1998 | Tajiri et al. | 359/15 |
| 5,748,658 | 5/1998 | Nakanishi et al. | 372/43 |
| 5,764,832 | 6/1998 | Tabuchi | 385/14 |
| 5,768,031 | 6/1998 | Yang | 359/565 |
| 5,774,239 | 6/1998 | Feldman et al. | 359/565 |
| 5,790,730 | 8/1998 | Kravitz et al. | 385/14 |

FOREIGN PATENT DOCUMENTS

| | | | |
|---|---|---|---|
| 0123048 | 10/1984 | European Pat. Off. | 359/16 |
| 0035701 | 2/1985 | Japan | 359/19 |
| 0118103 | 5/1989 | Japan | 385/14 |

OTHER PUBLICATIONS

Patent Abstracts of Japan, vol. 96, No. 009, JP 08–124204 Sep. 30, 1996.

*Primary Examiner*—Cassandra Spyrou
*Assistant Examiner*—John Juba, Jr.
*Attorney, Agent, or Firm*—Susan S. Morse

[57] ABSTRACT

A substrate having an optical element on an input surface thereof receives a light beam not having a desired beam shape and shapes the light beam into a predetermined intensity distribution. The substrate may further include a second optical element for providing a predetermined phase pattern to the light beam provided by the first optical element. The first optical element may, for example, circularize an elliptical light beam using a soft aperture for differential power attenuation or by altering the divergence of the light beam along the different axes of the light beam. When the divergence angles are altered and the collimating optical element is provided on the output surface, the thickness of the transparent substrate is determined in accordance with a resultant difference in the divergence and/or with the initial difference in beam size along each axis and with a required circularity. A light source is mounted close to the first optical element in order to minimize the amount of differing divergence present along the different axes of the light beam. The optical elements may be diffractive, refractive, or hybrids thereof and are preferably prepared photolithographically on the substrate itself. The light source may be mounted using fiducial marks and the photolithographic processes for forming the optical elements may also use fiducial marks. All elements of the integrated beam shaper may be formed on a planar, wafer level.

26 Claims, 6 Drawing Sheets

INTEGRATED BEAM SHAPER AND USE THEREOF

CROSS REFERENCES TO RELATED APPLICATIONS

This application makes reference to the following commonly assigned U.S. Patent Applications: U.S. application Ser. No. 08/833,220 filed Apr. 14, 1997 and now U.S. Pat. No. 6,008,941 entitled "Optical Soft Aperture and Use Thereof", U.S. application Ser. No. 08/727,837 filed Sep. 27, 1996 and now U.S. Pat. No. 5,771,218 entitled "Integrated Optical Head for Disk Drives and Method of Forming the Same", U.S. application Ser. No. 08/668,976 filed Jun. 24, 1996 and now U.S. Pat. No. 5,718,496 entitled "Improved Projection Pointer", all of which are hereby incorporated by reference.

BACKGROUND OF THE INVENTION

1. Field of the Invention

The present invention is directed to using optical elements mounted on a transparent substrate to correct, circularize, collimate or otherwise beam shape input light beams. In particular, the present invention is directed to providing an optical element as close to a beam to be shaped as possible within a passively aligned, mass produced system. The present invention is further directed to providing optical elements, positioned on opposite sides of a transparent substrate, to separately circularize and collimate a non-circular, uncollimated input beam.

2. Description of Related Art

Laser diodes are compact, efficient, inexpensive and capable of mass production. This has lead to an increasing number of applications for which laser diodes are used. However, the active region of the laser diodes is quite small and asymmetric. This results in a small and asymmetric beam waist. Consequently, the beam divergence is severe and asymmetric.

Failure to reduce or eliminate the ellipticity of the beam is sometimes unimportant, but many applications require collimated outputs with low optical aberrations. If the beam is to be collimated with a conventional lens for a particular application, the far field beam patterns will be different in the two directions, resulting in an elliptical beam. Thus, the ellipticity of the beam must be reduced by a subsequent optical system.

Astigmatism is a further property of laser diodes which presents an additional potential disadvantage in many applications. An uncorrected astigmatic laser beam cannot be collimated by a single radially symmetric lens. With an astigmatic laser, each axis appears to be diverging from a different point. Thus, collimation of both axes simultaneously with a single element requires an anamorphic element with different focal lengths for each axis. This astigmatism is corrected most advantageously by a subsequent optical system.

There have been numerous design solutions for collimating, circularizing and correcting wavefronts of diode lasers. One such solution includes using conventional cylindrical lenses to collimate each axis independently. However, the performance of such cylindrical lenses is degraded for more asymmetric beams, since skew rays cannot be corrected, and is hard to align.

Attempts to solve this difficulty in alignment are disclosed, for example, in U.S. Pat. No. 5,581,414 entitled "Microlens Assemblies and Couplers" to Snyder which mechanically establishes a fixed relationship between a pair of microlenses. A spacer positioned between the pair of microlenses includes a hole which acts as a hard aperture allowing light to pass between the lenses. The spacer provides a set spacing corresponding to the thickness of the spacer.

Another solution uses cylindrical lenses in conjunction with an aspheric collimator as disclosed in U.S. Pat. No. 5,553,174 entitled "Monolithic Cylindrical Optic" to Snyder. Herein, problems with the solution of the '414 patent were indicated as including mounting the lenses in close proximity to the face of the laser diode, thereby requiring that a can housing the laser diode be opened or the laser diode be provided without the can. In the '174 patent, this problem is solved by placing an aspheric collimator in front of a window of the can containing the laser diode to collimate the beam in the fast axis. A following lens is then used to collimate and magnify the slow axis to provide a collimated beam which is nearly circular.

Another configuration is shown, for example, in U.S. Pat. No. 5,229,883 to Jackson et al. As can be seen in FIGS. 2 and 3 of Jackson et al., a cylindrical lens 22 is used in conjunction with a binary optical element 28. The binary optical element 28 is designed such that each ray of light from the diverging input light source will travel the same optical path length or vary from the optical path length by a discrete multiple of the wavelength of the light traveling from its source to its exit from the front surface of the binary optical element. While the low horizontal divergence may typically be collimated with cylindrical optical elements with few resulting aberrations, collimation of the fast vertical divergence requires optical elements with increased optical power at a much lower f number which generally results in increased optical aberrations with the collimated output.

The cylindrical lens 22 is used to collimate the laser diode's output in the fast axis. Binary optics 28 include a substrate on which a binary optical diffraction pattern is etched. The binary optic diffraction pattern is typically an eight phase level structure which corrects for optical path differences inherent in the divergent light. The binary optical element collimates the slow axis divergence and corrects for skew ray aberration of rays not in either the fast or slow axis. These additional corrections are inherent in a binary optical element whose diffraction pattern is chosen so as to have each optical ray travel in equal optical path lengths or an optical path length that varies from that equal optical path length by integer multiple of the wavelength of light traveling therethrough.

In order to provide proper correction of the beam output from the laser diode 10, the cylindrical lens 22 and the diffractive optical element 28 in the Jackson et al. configuration must be both properly positioned along the optical axis, but also rotationally aligned with one another. This rotation alignment is crucial, since the different axes are treated differently. This rotational alignment can be difficult and sensitive, requiring expensive continuous rotational alignment.

When two elements, both providing optical power, need to be aligned, often active alignment is required. Active alignment is performed by turning on a beam and continuously adjusting the optical elements until a desired beam is achieved. Such active alignment is difficult and expensive. When optical power is provided by both elements, optimal alignment of a single element alone may not provide satisfactory alignment with the other optical element to provide the optimum results for the system as a whole.

Indeed, creating a desired circular beam presents such problems that one solution when using elliptical beams is to merely compensate for the ellipticity rather than reduce the ellipticity. Such a solution is shown, for example, in U.S. Pat. No. 5,204,516 entitled "Planar Optical Scanning Head Having Deficiency-Correcting Grating" to Opheij, in which an input grating 7 is used to couple an elliptical input beam 6 into a waveguide 9, but ellipticity of the beam itself is not reduced prior to entering the waveguide.

SUMMARY OF THE INVENTION

It is an object of the present invention to provide optical elements mounted on a transparent substrate which shapes an input beam to more closely approximate a desired beam profile while already being appropriately aligned.

It is a further object of the present invention to provide a means and method of reducing ellipticity and otherwise beam shaping a non-circular beam using a single optical element.

It is yet another object of the present invention to provide beam shaping using optical elements for which active alignment is not required.

It is a further object of the present invention to provide the beam shaping elements in a can including a laser diode.

It is another object of the present invention to provide beam shaping in a system which is compact, passively aligned, and mass-produced.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below in the accompanying drawings which are given by way of illustration only, and thus are not limited to the present invention and wherein:

FIG. 4b is an alternate embodiment of the configuration shown in FIG. 4a;

DETAILED DESCRIPTION OF THE PREFERRED EMBODIMENTS

Figures 1A, 1B, 1C, 2:
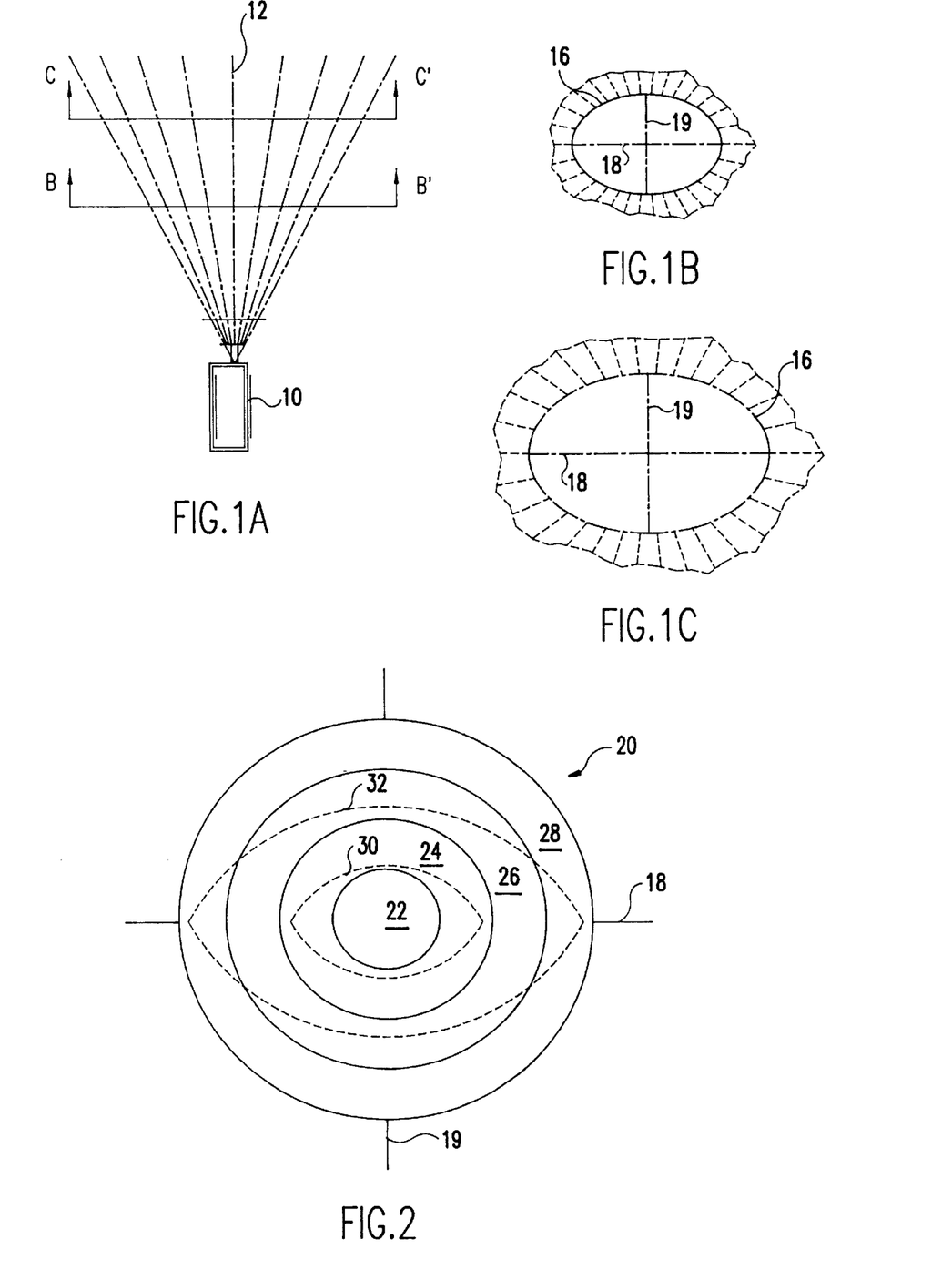
FIG. 1a shows a beam output from a laser without any beam shaping thereof.
FIG. 1b shows the beam resulting from the configuration in FIG. 1a taken along the line b–b'.
FIG. 1c shows the beam resulting from the configuration in FIG. 1a taken along the line c–c'.
FIG. 2 is a schematic of a diffractive optical element of the present invention.

As shown in FIG. 1a, a laser diode 10 outputs a beam along an optical axis 12. As can be seen in FIGS. 1b and 1c, a beam profile 16 stays elliptical and gets larger, so that the difference between the beam size along the axes increases, as it propagates away from the laser diode 10. In particular, the beam is wider or more divergent along a fast axis 18, and is narrower or less divergent along a slow axis 19. Conventional configurations used to address this ellipticity were discussed above in the Background. As noted above, it is often desirable to shape this beam to obtain a more circular profile. Further, other desired profiles may be obtained.

Soft Aperture

As can be seen in FIG. 2, the general concept of one embodiment of the present invention involves providing an optical element 20 which increases power attenuation towards the outer edge thereof. Increasing power attenuation, when used with diffractive embodiments of the present invention, means a decrease in the amount of power diffracted into a desired diffractive order. Typically, the desired diffractive order will be the first order, but the element 20 may be designed to utilize any order, including zero and orders higher than one.

In a diffractive element, typically all of the power in the beam is transmitted therethrough, the diffractive element shaping the beam by directing portions thereof into various diffractive orders. Therefore, in connection with the present invention, the term power attenuation means power reduction in a desired output beam.

The radially increasing amount of attenuation as shown in FIG. 2 creates a "soft" aperture. This is in contrast to the hard aperture typically provided by conventional optical elements which have a sharp boundary outside of which light cannot pass. Such a hard aperture results in Airy disk type patterns or ringing from diffraction.

The soft aperture as shown in FIG. 2 attenuates power in the fast axis at a faster rate than the Gaussian beam. The transmission in this soft aperture gradually decreases from one inside the center to zero at the edges. Therefore rather than being an all or nothing type hard aperture, a soft aperture serves to attenuate power as the beam is spread away from the central location.

The path of the beam through the element 20 is illustrated by the dashed ellipses in FIG. 2. The inner dashed ellipse 30 indicates the half intensity points of the Gaussian beam output by a laser diode, at which point the beam has one-half of the intensity of the peak intensity at the center of the beam. The outer dashed ellipse 32 illustrates the $1/e^2$ points of the Gaussian beam output by the laser diode. The $1/e^2$ point defines the beam radius and is the point at which the intensity of the beam has fallen to 13.5% of the maximum intensity at the center.

The dashed ellipse 30 illustrate that for the region where the intensity of the beam is greater than half of the peak value, i.e., full width at half maximum, the beam along the slow axis 19 will encounter only the inner region 22, while along the fast axis 18, the beam will encounter both the inner 22 and the first 24 intermediate regions. Similarly, the dashed ellipse 32 illustrates that for the region where the intensity of the beam is between 13.5% of the maximum intensity and half of the maximum intensity, the beam along the slow axis will encounter only the first intermediate region 24, while along the fast axis 18, the beam will encounter the second intermediate region 26 and the outer region 28. Thus, the power along the fast axis 18 is more greatly attenuated than the power along the slow axis 19, while not attenuating a region of the beam having the peak intensity.

These varying degrees of power attenuation may be achieved in a number of manners. For example, an increase in power attenuation away from a center of the soft aperture may be achieved by providing any of the following: a decreasing number of phase levels a number of phase levels away from the center, an increasing a number of phase levels away from the center, an increasing a density of scattering portions, e.g., metal patches, away from the center, and etchings varying in height and/or duty cycle away from the center.

In the configuration shown above, in the slow axis direction, almost no power hits the further out regions so there is little or no attenuation in the slow axis direction. In contrast, in the fast axis direction, a lot of power will hit the outer regions of the element. The reduction of power experienced by hitting these outer regions will circularize the output.

Divergence Angle Varying Elements

As an alternative to removing power from the system as achieved by the soft aperture to circularize the beam, a diffractive optical element (DOE) 40 which alters divergence of a beam input thereto differently along different axes may be placed on the first surface 42a of a substrate 42. The DOE 40 incorporating a computer generated hologram is designed using the computer calculations and manufactured using lithographic techniques taught by U.S. Pat. No. 5,161,059 to Swanson, which is hereby incorporated by reference, for a particular input and desired output beam.

Figure 3A:
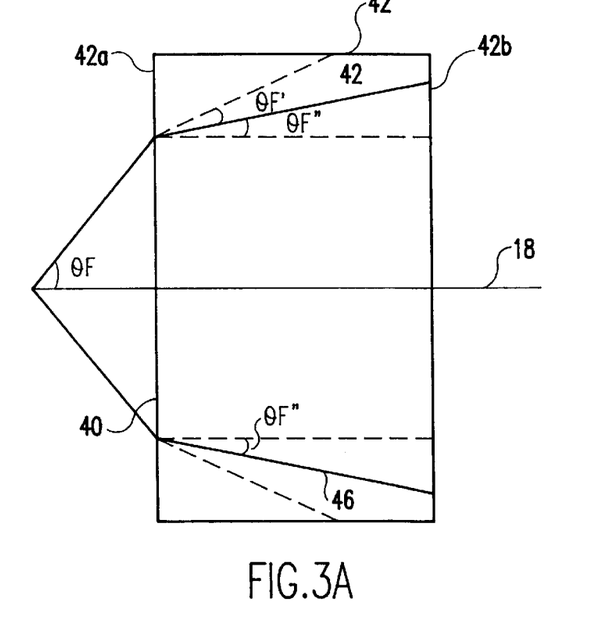
FIG. 3a is a schematic of the light traversing the fast axis of the divergence altering DOE integrated on a substrate.

An input beam impinging upon a substrate 42 will be bent due to refraction at the interface thereof. This refraction alters the angle at which the light beam is travelling. As shown in FIG. 3a, the angle $\theta_f$ of the light beam along the fast axis is reduced to $\theta_f'$ upon entering the substrate 42. Similarly, as shown in FIG. 3b, the angle $\theta_s$ of the light beam along the slow axis is reduced to $\theta_s'$ upon entering the substrate 42.

The DOE 40 on an input surface 42a of the substrate 42 is employed to further reduce the divergence angle of the input beam along the fast axis, as shown in FIG. 3a, from $\theta_f'$ to $\theta_f''$ where $\theta_f'>\theta_f''$. The dashed lines illustrate the divergence angle $\theta_f'$ of the input beam along the fast axis would take absent the DOE 40, while the solid lines indicate the divergence angle $\theta_f''$ of the output beam from the DOE 40.

Figure 3B:
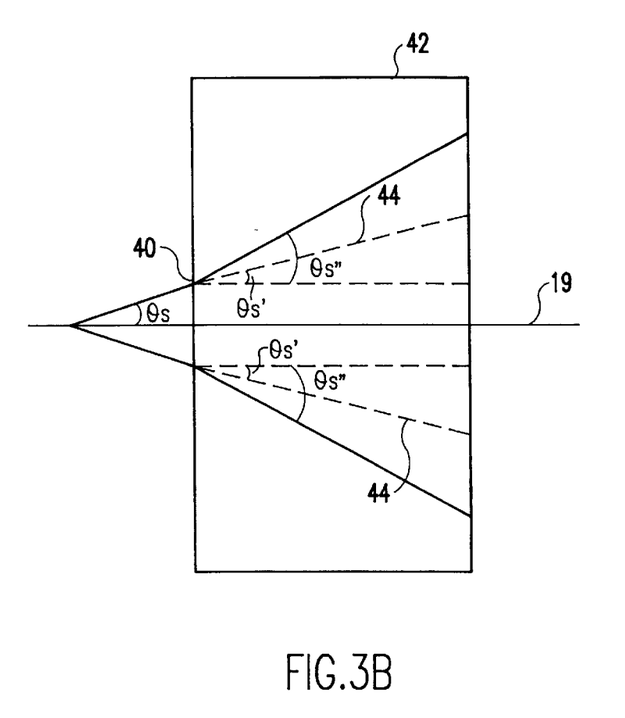
FIG. 3b is a schematic of the light traversing the slow axis of the divergence altering DOE integrated on a substrate.

The DOE 40 also increases the divergence angle of the input beam along the slow axis, as shown in FIG. 3b, from $\theta_s'$ to $\theta_s''$ where $\theta_s'<\theta_s''$. The dashed lines illustrate the divergence angle $\theta_s$ of the input beam along the slow axis would take absent the DOE 40, while the solid lines indicate the divergence angle $\theta_s'$ of the output beam from the DOE 40.

The divergence angles along the respective axes may be altered in variety of ways. Unlike refractive elements, which can alter an incoming angle into a number of outgoing angles with little effect on the efficiency thereof, the more an incoming angle is deviated from, the more power is lost in the diffractive element. For example, in the solutions noted in the Background section, a refractive element was used to collimate the beam, along one axis, i.e., reduce the divergence to zero. However, such a reduction is not the most efficient use of a DOE. Therefore, determining the exact configuration of the beam exiting the diffractive element involves considering the amount of optical power desired along each axis.

There are two principal useful solutions in accordance with the present invention for achieving the desired result of a circularized beam using a DOE in accordance with the present invention. The first solution involves designing DOE 40 to output the beam along each axis as having the same divergence angle, i.e., in the output of the DOE 40, $\theta_s' \approx \theta_f'$. This near equality is most efficiently achieved by increasing the divergence angle of the slow axis by approximately the same amount as the divergence angle of the fast axis is decreased. To a first order approximation, these angles will be equal. In other words, $\theta_s''-\theta_s' \approx \theta_f'-\theta_f''$.

Since the divergence angles of the fast and slow axis upon exiting the DOE 40 are the same, it is evident that the disparity in beam dimensions along the fast and slow axes present when the beam impinges on the DOE 40 will not be compensated, although the disparity will be prevented from increasing as the beam propagates away from the DOE 40. Therefore, circularity is achieved in the present embodiment by allowing the beam emerging from the DOE 40 to propagate far enough so that the beam dimensions are much, e.g., a couple orders of magnitude, larger than the initial disparity, such that the initial disparity becomes negligible. The point at which the beam dimensions are sufficiently large depends upon the degree of circularity required.

For example, if, at the input to the DOE 40, the beam along the fast axis is 40 microns larger than the beam along the slow axis, once the entire beam has expanded to a spot size of 1 mm, the 40 micron difference which still exists between the beam along the slow axis and the beam along the fast axis will be negligible, i.e., the beam will be substantially circular.

In order to keep the difference between the dimensions of the beam on the slow and fast axis on the DOE small, the DOE must be placed very close to the light source, typically a laser. For example, if the divergence angles of the laser are 11° and 33° of the slow and fast axis respectively, in order to keep the difference between the beam dimensions on DOE 40 less than 40 microns, the DOE 40 must be placed within approximately 100 microns of the laser. To keep the difference in beam dimensions to less than 200 microns, the DOE 40 must be placed within 500 microns of the laser.

Typically, a laser diode is mounted inside a cylindrical housing called a can. The can is typically about 2 mm in length. Therefore, if the laser diode is to be placed within a can, the DOE 40 must also be placed within the can.

Since this first solution results in a beam output from the DOE 40 having the same divergence angles along either axis, the beam may be collimated by a conventional optical element anywhere after the DOE 40. Where such a conventional element is to be placed will be determined by the desired beam size. Assuming the desired spot size is 1 mm, and the divergence angles of the beam emerging from the DOE 40 are 22 degrees in each direction, then the distance between the DOE 40 and the collimating lens will be approximately 2.5 mm. By making the can slightly longer than a conventional can and placing the collimating lens on the output surface 42b of the substrate having a thickness of the desired distance from the DOE 40 to the collimating element, here, 2.5 mm, all of the desired optics for shaping the beam are integrated with the laser itself inside the can.

If the distance required between the DOE 40 and the collimating element is required to be larger, the collimating element may be placed outside the can. For example, if the desired beam is to have a diameter of 1 cm, the distance from the DOE 40, assuming the same laser parameters as above, will be 25 mm. For such a distance, the collimating element is preferably placed outside the can. Also, if distance dictates, the collimating element may be placed on top of the can itself. When the collimating element is not located on the output surface 42b of the substrate, the divergence angles output from the DOE and/or the distances between a collimating element and the substrate may be altered in accordance with an index of refraction of the substrate to achieve the desired beam.

Further, DOE 40 used for circularizing the beam may be formed on a refractive, making the element on the input surface a hybrid.

If space is particularly constrained, the beam may be made more divergent along the slow axis in order to more quickly provide sufficient circularization, i.e., minimize the effect of the initial dimensional difference of the input beam, thereby reducing the thickness d of the substrate 42. Since the beam for this configuration will not be perfectly circular, the use of a soft aperture at either surface 42a, 42b, integrated with any other element thereon, may be used to further aid in circularization. Further, a soft aperture may be used to reduce the thickness d of the substrate 42 by aiding in circularizing and shaping the beam.

The second solution involves altering the divergence angles of the fast and slow axes such that at the output of the DOE 40, the slow axis has a divergence that is greater than the divergence angle of the fast axis. In other words, $\theta_s''>\theta_f''$. Again, as in the first method, the absolute value of the difference between the input angles and the output angles along either axis are preferably approximately the same, i.e., $\theta_s''-\theta_s=\theta_f'-\theta_f''$.

Such a configuration allows the dimensions along both axes to be equal at some propagation point. However, now a second element to receive the desired beam shape, in this example, a collimating element, will have to be precisely located. After a certain distance, the two diverging angles will produce substantially the same size beam along the respective axis. This distance will determine the thickness d of the substrate 42. The design of this configuration presents a trade off considering that the greater the change in the angles the thinner the substrate 42 can be, but the lower the efficiency of the DOE 40.

The distance d is governed by the following equations:

$$X_f=2s \tan(\theta_f/2)$$

$$X_s=2s \tan(\theta_s/2)$$

$$D_s=\Delta X_s+X_s$$

$$D_f=\Delta X_f+X_f$$

$$\Delta X_f=2d \tan(\theta_f''/2)$$

$$\Delta X_s=2d \tan(\theta_s''/2)$$

where D is the diameter of the spot on the output surface 42b of the substrate 42 along the respective axes when the DOE 40 is present, s is the distance from the laser to the input surface 42a, X is the diameter of the spot on the input surface, and ΔX is the change in size of the beam from the input surface 42a to the output surface 42b along the respective axes when the DOE 40 is present.

For most lasers, the divergence angles $\theta_f$ and $\theta_s$ are fixed. While the value s can be set, typically the laser will be placed as close as possible to the substrate 42. Therefore, for most systems, the value of X is fixed. Thus, in designing the configuration shown in FIGS. 3a and 3b in accordance with the second solution, the degrees of freedom in obtaining a desired diameter D are d, $\theta_f''$ and $\theta_s''$.

The smaller the value of the distance d, the easier it is to manufacture, the separation between the surfaces may be more accurately controlled, and the easier the substrate will be to align, since alignment is typically achieved by looking through the substrate. However, the smaller the value of d, the larger the change in the divergence angles required, resulting in less efficient DOEs. Further, the larger the value of d, the larger the beam will be at the second surface 42b, making operation thereon of optics placed on this surface easier.

Typically, the value of D is chosen by the application. Then, a value of d is chosen that is the largest value that can be accommodated by the manufacturing process. This then will determine the values of the change in divergence angles.

For example, assume the laser having divergence angles of approximately 11° ($\theta_s$) by 33° ($\theta_f$) is placed a distance of 200 microns (s) from the DOE 40. Then, the spot size on DOE 40 would be approximately 60 microns ($X_s$) by 120 microns ($X_f$). If the maximum thickness (d) that can be tolerated by the manufacturing process is 1 mm and the desired spot diameter (D) of the collimated beam is 400 microns along both axes, then the divergence angles upon exiting DOE 40 should be approximately 16° ($\theta_f''$), or a decrease of 17°, along the fast axis and 20° ($\theta_s''$), or an increase of 9°, along the slow axis. This will result in a circular beam on the surface 42b of approximately 400 microns.

A collimating element is located on the surface 42b to provide the desired 400 micron collimated beam output by the substrate 42. Note that this collimating element will need to be anamorphic since the divergence angles of the beams along the two axes will be different. In other words, the collimating element will have different effective focal lengths along the two axes. This collimating element, or the DOE 40, can also be used to correct for astigmatism of other aberrations. If correction is used, the element will need to be aspheric. Fabrication of an anamorphic aspheric refractive element is difficult, thus integration of this function into the DOE 40, use of a diffractive for the collimating element at the surface 42b, or integration of a correcting diffractive element with a collimating refractive on the surface 42b is preferred.

Finally, the use of soft apertures in conjunction with either type of the divergence angle varying DOEs is particularly useful. Divergence angle specifications for light sources, even from the same manufacturer, can vary widely. The proper operation of the divergence angle varying DOEs depends upon knowing the divergence angles of an incoming beam to be shaped. Separate design and manufacture of DOEs for each individual light source in clearly impractical. However, by incorporating a soft aperture on the transparent substrate, preferably on the input surface 42a thereof, uniformity of the divergence angles may be realized. In particular, for the specific example discussed above, a soft aperture that quickly attenuates light outside of the divergence of 11° by 11° may be used. Thus, even if the divergence angles from the light source were greater than these values, the circular beam shape and divergence angles thereof for which the second optical element was designed would still be provided to the second optical element.

Integrated Beam Shapers

In the above configurations, a first element on a first surface 42a of the substrate is used to provide a desired intensity pattern on a second element on a second surface 42b. In the examples discussed above, this desired intensity pattern was a circular pattern. The second element is used to provide a desired phase profile, in the examples above, a collimated beam. In general, the present invention may be used to create arbitrary intensity and phase profiles, with the first element, DOE 40, creating the desired intensity pattern on the second element and the second element creating the desired phase profile.

For example, for many applications, the circular beam needs to be focussed at a particular distance, rather than collimated. This can be achieved by using a focussing element as the second element 48, rather than a collimating element. Further, the DOE 40 can be used to create a variety of intensity patterns or beam shapes, such as a flat top, square, circular, rectangular, elliptical, axicon, a cross-hair, a pattern of multiple spots, a grey-scale image, other non-Gaussian intensity distributions, etc., on the second surface 42b. Any of refractive, diffractive or hybrid elements may be used to generate the desired phase transmittance.

Figure 4A:
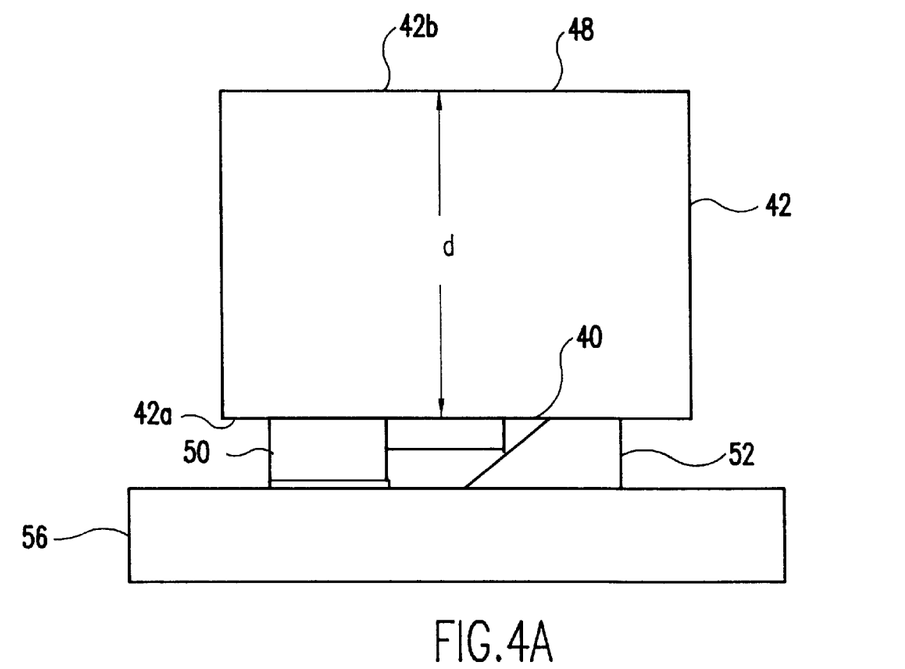
FIG. 4a is a side view of a configuration of the present invention.

The shaping the light beam will be most effective when the dimensions of the beam entering the input surface 42a are small, i.e., the beam has not travelled very far from its source, such that the difference in axial dimensions will be minimized. An example for achieving this is shown in FIG. 4a, in which a light source, typically a laser, such as a laser diode, 50, shown as an edge emitting laser, is mounted next to a precision mirror 52, both of which are mounted underneath the substrate 42. There is sufficient space between the top of the laser 50 and the bottom or input surface 42a for necessary leads to be provided to conventional circuitry, not shown.

The precision mirror 52 receives the light output from the laser 50 and directs it upwards to the substrate 42. If the edge emitting laser 50 is replaced with a vertical cavity surface emitting laser, the precision mirror 52 will clearly no longer be required. The laser 50 and the mirror 52 may be mounted through additional conductive pads on a substrate 56, which acts as a heat sink. The bonding and alignment of the active elements 50, 52 on the heat sink 56 allows the active elements 50, 52 to be tested before the optical elements are integrated therewith.

As can be seen from this configuration, since the beam output from the laser 50 is very divergent, especially along the fast axis, not all of the beam will impinge upon the mirror 52. Rather, a portion of the beam will impinge upon the substrate 42 directly. The failure of the entire beam to be reflected by the mirror 52 results in clipping, such that the beam input to the DOE 40 will not be Gaussian. The clipping makes this interface act as a hard aperture, resulting in ringing in the far field.

This clipping may be compensated for by integrating a soft aperture 20 with the DOE 40. When used in this capacity, the soft aperture 20 does not necessarily serve to circularize the beam, but shapes the beam to be more smoothly attenuated, thereby reducing ringing in the far field. The soft aperture may be provided by a diffractive element or with lithographically patterned metal patches as desired. These two techniques for achieving the soft aperture are particularly useful when mass producing the integrated beam shaper of the present invention, discussed below, since they allow the soft apertures to be efficiently produced on a wafer level.

Figure 4B:
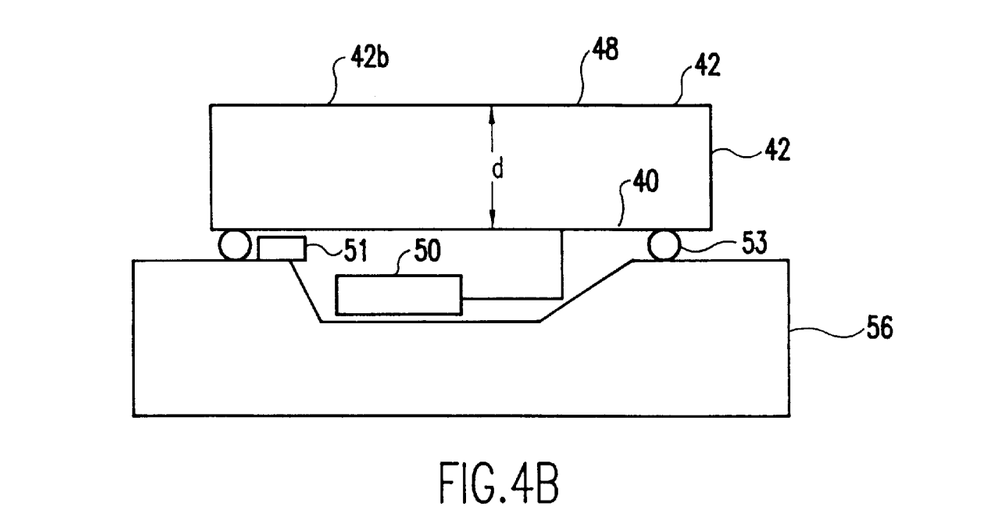

FIG. 4b illustrates an alternative to the configuration shown in FIG. 4a. As shown in FIG. 4b, when the laser 50 is to be mounted on the heat sink 56, the mirror 52 may be integrated into the heat sink 56, thereby eliminating a mounting step. Preferably, the heat sink 56 is a silicon wafer and the mirror can be formed by etching along a crystalline plane of the silicon.

Also shown in FIG. 4b is a monitor diode 51, placed behind the laser 50 and receiving light output from the back of the laser 50. A surface for directing the light output from the back of the laser 50 is also integrated into the heat sink 56. The monitor diode 51 is used to indicate that the laser 50 is operating within normal parameters. Alternatively, the monitor diode 51 can be integrated into the heat sink 56.

Solder balls 53 are alignment features used for facilitating alignment between the substrate 42 and the heat sink 56. The placement of the solder balls insures the light to be corrected is provided on the DOE 40. The solder balls 53 also provide offset between the substrate 42 and the heat sink 56 in order to allow the required electrical connections to the active elements, e.g., the laser 50 and the monitor diode 51.

Alternatively, in the configurations shown in FIGS. 4a and 4b, when the laser 50 is to be mounted on the heat sink 56 and the substrate 42 is diced before being placed on the heat sink 56, the substrate 42 carrying the optical elements only needs to be provided over the mirror 52 in order to receive the light from the laser 50. Such mounting of the substrate facilitates connections to the laser 50, such as heat sinking and electrical leads.

The configurations shown in FIGS. 4a and 4b allow the light from the laser 50 to be input to the DOE 40 or soft aperture 20 after only travelling a short distance, e.g., 100 microns, from the laser emitting area. Previous configurations did not allow such close proximity of the laser because the optical elements used therein could not fit into a can housing the laser. The housing or can enclosing the laser fits in the back of a tube and the optics were aligned within this tube. The tolerances required for aligning these macroscopic optics were 1–2 mils. In contrast, the integrated approach of the present invention, as shown, for example, in FIG. 7, in which the laser is integrated with the substrate 42 and then this integrated element is situated in a can, has tolerances of 1–2 microns.

The closer the laser 50 is to the beam shaper of the present invention, the less the difference in spot size of the light in the fast and slow axes. When the beam shaper of the present invention uses a divergence varying DOE 40, the substrate 42 can be thinner. Thus, this close proximity allows the differing divergences between the fast and slow axes of the beam output by the laser 50 to be shaped for more effectively. Further, the substrate 42 can be thinner and hence an overall device in which the beam shaper of the present invention is to be incorporated will be thinner.

Figure 5:
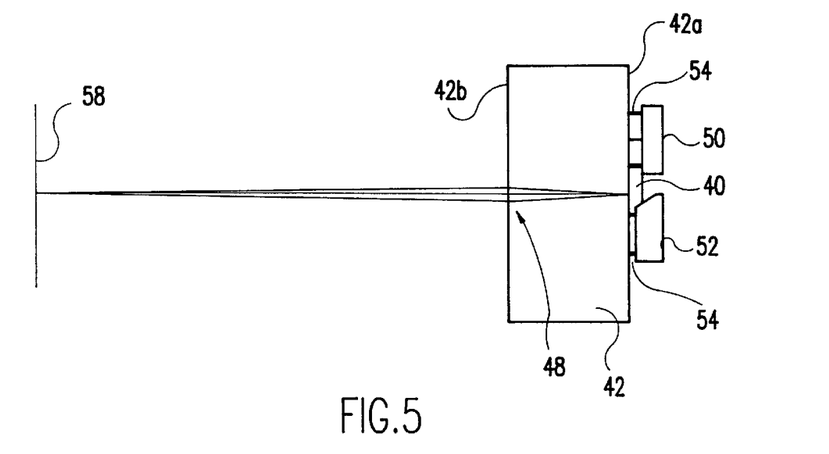
FIG. 5 is a side view of another configuration of the present invention.

FIG. 5 is a side view of another configuration, and better illustrates the passive alignment which may be used in producing any of the configurations. Fiducial marks are placed on a bottom surface 42a of the substrate 42. These fiducial marks are used to place mounting alignment features 54 on the bottom surface 42a for mounting the electrical components thereon, e.g., the laser 50 and the mirror 52. For active components, metalized pads advantageously serve as the alignment features.

The optical elements 42 and 48 are advantageously created photolithographically using the same fiducial marks used to place the alignment features, for example, metalized pads 54. Alternately, additional fiducial marks that have been aligned with the first fiducial marks may be used to align the masks to create the optical elements. Since the wafer are all thin and transparent, use of the fiducial marks is easily realized.

In this manner, when the light source 50 and the mirror 52 are mounted on their respective metalized pads 54, the optical paths among the devices and through the optical elements are in optical alignment. When mounting the light source and mirror, the solder on metalized pads is reflowed and then hardened to place the light source and mirror into the appropriate positions, attaching them to the substrate 42. As can be seen in FIG. 5, the light beam output from the substrate 42 incorporating the beam shaper of the present invention will be properly focused on an intended object 58. In the particular configuration shown in FIG. 5, the optical element 48 is a diffractive element which separates the shaped beam from the DOE 40 into a plurality, e.g., three, beams to be focused separately on the intended object 58.

As can be seen by comparing FIGS. 4a and 4b with FIG. 5, the configuration in FIG. 5 is simpler, i.e., all elements are on the same substrate. However, the configuration in FIG. 5 is more difficult to heat sink sufficiently as compared with the mounting of the components 50, 52 on a separate heat sink 56 as shown in FIGS. 4a and 4b.

Mass Production of Integrated Beam Shapers

In addition to efficiently shaping, e.g., reducing ellipticity, an output beam, the configurations shown in FIGS. 4a, 4b and 5 may all be mass produced. The DOEs 40 may be mass produced directly using photolithographic techniques taught, for example, by U.S. Pat. No. 5,161,059 to Swanson, which is hereby incorporated by reference or by using photolithographic techniques to create a master for use in injection molding or embossing into a polymer. These production techniques are applied on a wafer level so that a plurality of the DOEs may be made simultaneously and a corresponding plurality of light sources may be mounted adjacent thereto. On a wafer level, the plurality of elements produced is on the order of tens to thousands.

Figure 8A:
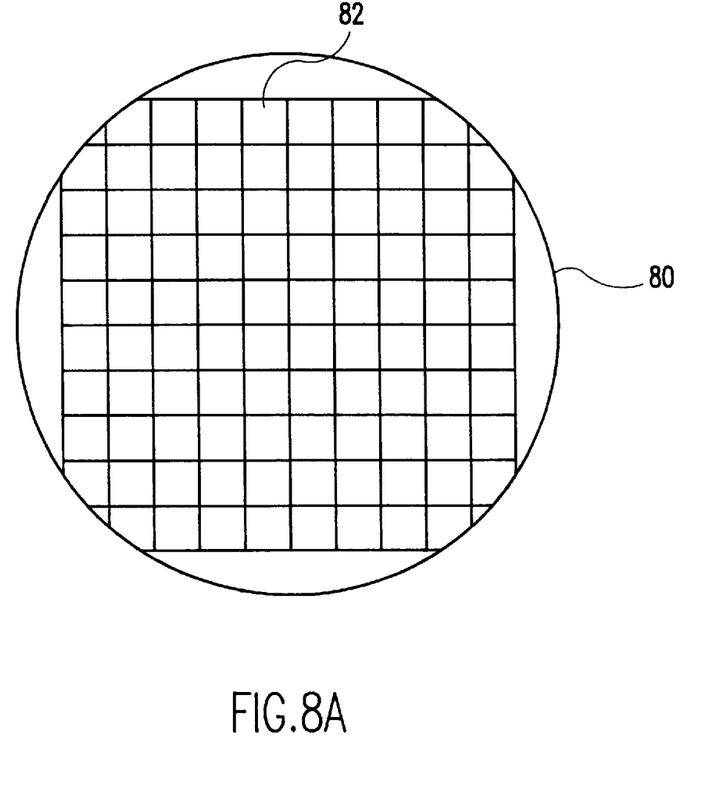
FIG. 8a is an elevational top view of a wafer containing a plurality of optical elements.

An elevational top view of a wafer 80 having a plurality of elements 82 provided thereon is shown in FIG. 8a. The wafer 80 may be the transparent substrate 42 and the elements 82 may be optical elements provided on either side thereof, or the wafer 80 may be the heat sink and the elements 82 may be active elements provided thereon. Preferably, the transparent substrate wafer is glass, e.g, fused silica, and the heat sink wafer is silicon.

Figure 8B:
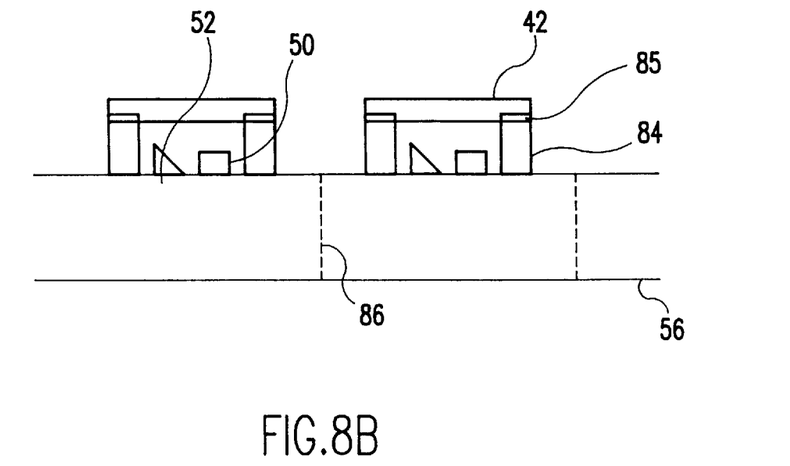
FIG. 8b is an elevational view of a general form of the wafer level production of the integrated beam shaper in accordance with the present invention.

FIG. 8b is an elevational side view of a plurality of integrated beam shapers before they are diced to form the individual integrated beam shapers of the present invention. In the particular configuration shown in FIG. 8b, the transparent substrate containing the optical elements are diced and then mounted at appropriate positions adjacent the active elements on the heat sink, with spacer elements or stand-offs 84 therebetween. The die 42 may include notches 85 for receiving the stand-offs 84, to mechanically insure alignment. The dashed lines 86 indicate the lines along which the heat sink is to be diced.

Previously, lasers had been mounted on a heat sink and provided in a housing with an optical element, see, for example, U.S. Pat. No. 5,130,531 to Ito et al. entitled "Reflective Photosensor and Semiconductor Light Emitting Apparatus Each Using Micro Fresnel Lens" and U.S. Pat. No. 4,757,197 to Lee entitled "Semiconductor Laser and Detector Device." However, these patents are not directed to providing an integrated beam shaper or providing the laser as close to the optical element as possible. Such close spacing imposes strict alignment requirements which can only be achieved with the manufacturing methods discussed below.

Figure 9:
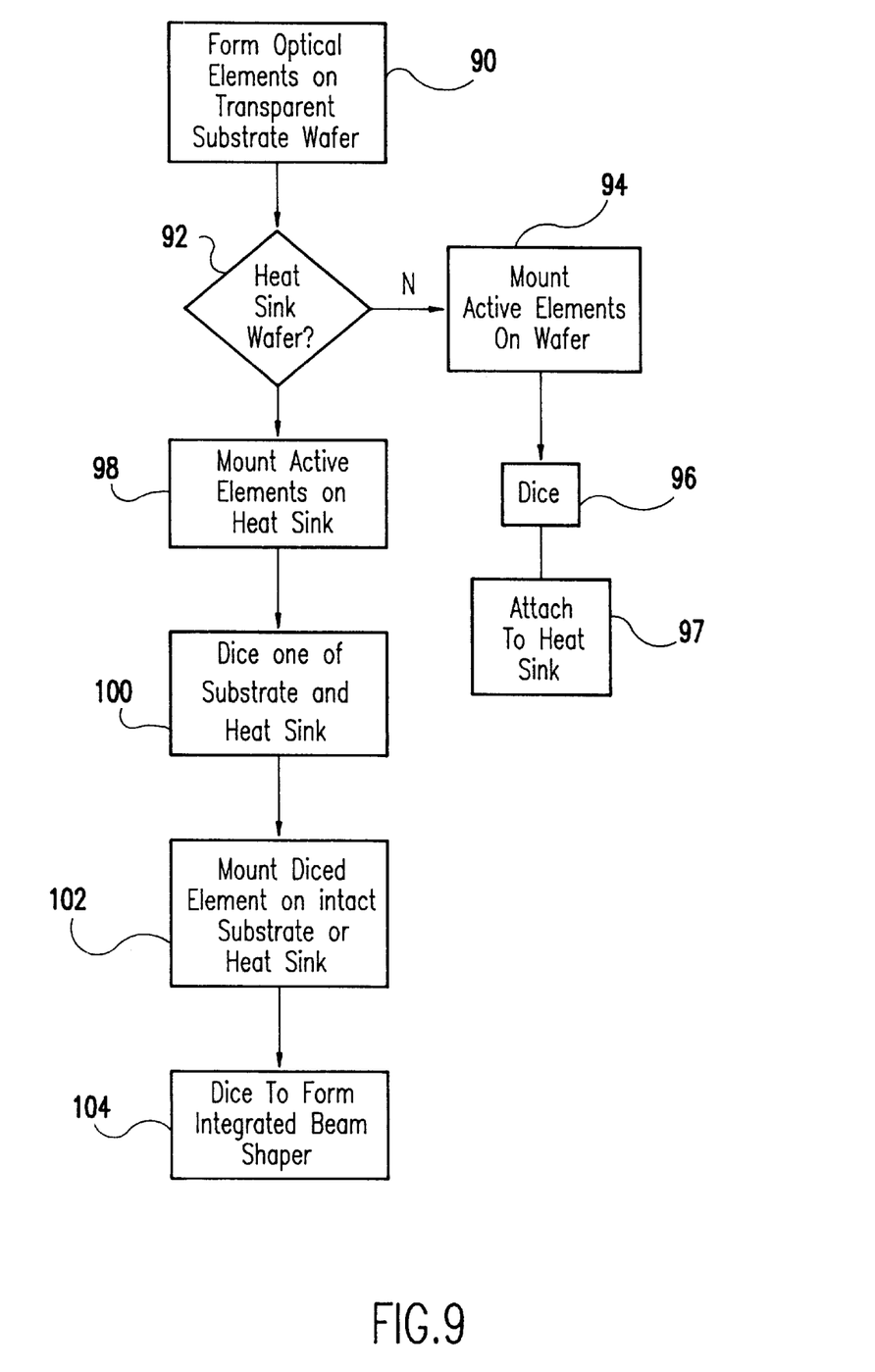
FIG. 9 is a flow chart of the wafer level production of the integrated beam shaper in accordance with the present invention.

A general overview of the manufacturing process in accordance with the present invention is shown in FIG. 9. In step 90, optical elements are formed on the wafer level on the transparent substrate 42. In step 92, the process diverges based on whether a heat sink is used on the wafer level, as shown in FIGS. 4a and 4b, or not so used, as shown in FIG. 5. When a heat sink is not employed, the active elements are mounted on the transparent substrate wafer in step 94. The transparent substrate wafer is then diced to form individual integrated beam shapers in step 96. Typically, this die will then be mounted on a heat sink for dissipating heat from the active elements in step 97.

If a heat sink is employed on the wafer level, the active elements are mounted on a heat sink wafer in step 98. In step 100, either the transparent substrate wafer or the heat sink is diced. In step 102, the dies from step 100 are mounted with the remaining intact wafer. In step 104, the intact wafer is then diced to form individual integrated beam shapers.

Alternatively, when using the heat sink, the transparent substrate wafer may be mounted with the heat sink wafer all at once, before either wafer is diced. However, it is advantageous for a die from one of the wafers to be elongated compared to a die from the other wafer, as shown in FIG. 8b, in order to facilitate the electrical connections of the active elements to respective circuitry thereof. This difference in dimension requirement makes use of wafer to wafer mounting less attractive except where dicing may be performed only on one wafer of the bonded pair. The use of the alignment features discussed below make the dicing prior to mounting on the other wafer shown in the flow chart of FIG. 9 a more practical alternative. The provision of alignment features discussed above in connection with FIG. 5 facilitates the provision of optical elements on either side of the substrate and the mounting of the laser and mirror in all of the various production methods noted above, as well as the bonding of dies to another wafer. The passive alignment eliminates the requirement that the elements be aligned with the laser turned on. The lasers may be easily tested prior to integration with the optical elements. Using the passive alignment features renders the production of the packages on a wafer level feasible. Only by eliminating the need for active alignment through use of the passive alignment techniques in accordance with the present invention can wafer level production of integrated beam shapers be realized.

Typically, the alignment accuracy needed for the integrated beam shaper of the present invention is approximately one sixtieth the focal length of the DOE. Thus, if the DOE is placed approximately 200 microns from the laser, the alignment accuracy of the laser to the DOE in the transverse direction would be approximately ±3 microns. With conventional mounting technology, even using the expensive and difficult active alignment noted in the Background, it is very difficult to achieve alignment accuracy to better than one one-thousandth of an inch or about 25 microns. Alignment precision of 25 microns or less is very difficult and, therefore, very expensive with conventional mechanical positioning. However, using the wafer level batch photolithographic processing discussed above, with alignment features, very good alignment accuracy, down to ±1 micron can be achieved very economically.

First, the lasers need to be precisely positioned on the heat sink wafer. This positioning may be accomplished by patterning metal on a wafer containing the lasers themselves in precise locations. Then the heat sink wafer is patterned with metal in corresponding locations. Solder is placed on each of the metal pads on the heat sink wafer. The laser wafer can then be diced and each laser die placed individually on each location on the heat sink wafer. The lasers can be placed on the wafer very quickly with low alignment precision. Then, when the solder is reflowed, surface tension will self-align all of the lasers very quickly.

When the lasers are mounted on a heat sink wafer which is to serve as the intact wafer, optical element dies can be attached to the heat sink wafer directly or to spacer elements placed on the heat sink wafer.

Next, when the optical die are placed down, they need also to be placed with great precision. Since the lasers are aligned precisely to the heat sink wafer, the optical die also can be aligned to the heat sink wafer. This can be done as above with solder and reflow, if metalization pads are placed on the optical die and on the heat sink wafer. To do this, however, again the optics must be made in a planar wafer form, so that the lithographic process for the metalization can be used to perform the metal patternization simultaneously on many dies. Alternatively, for the bonding of either the lasers or the optical die, mechanical features such as standoffs and notches could be used, as shown in FIG. 8b, and other such alignment features as disclosed in co-pending, commonly assigned U.S. application Ser. No. 08/727,837 filed Sep. 27, 1996 entitled "Integrated Optical Head for Disk Drives and Method of Forming the Same", which is hereby incorporated by reference.

Also, the optical die could be bonded with an adhesive or epoxy rather than with solder. Solder is preferable in many applications because it is smoother and flatter than epoxy, allows easier movement prior to bonding and self-alignment properties can be used. Epoxy has the advantages of being less expensive for a number of applications, it can be bonded with or without heating, it does not suffer with oxidation, and it can be transparent. If an adhesive, such as a UV cured epoxy, is used, it is useful to place ridges on the optical die to hold the epoxy before it is cured (when it is a liquid). If epoxy is used, it is useful to put alignment marks on each optical die and corresponding alignment marks on the silicon wafer. Then each optical die can be placed with a pick-and-place machine that will place the die to align the alignment marks on the die with those on the wafer. Again the patternization of these alignment marks means that such alignment marks will only be practical, allow for high volume, low cost applications, if both the optics and the heat sink wafer are made in planar wafer form.

The alignment is similarly accomplished with the other manufacturing processes discussed above. For example, the solder and reflow method may be used while providing metal pads on the bottom of the laser and mirror to directly mount these elements on corresponding metal pads on the transparent substrate as shown in FIG. 5.

Figure 6:
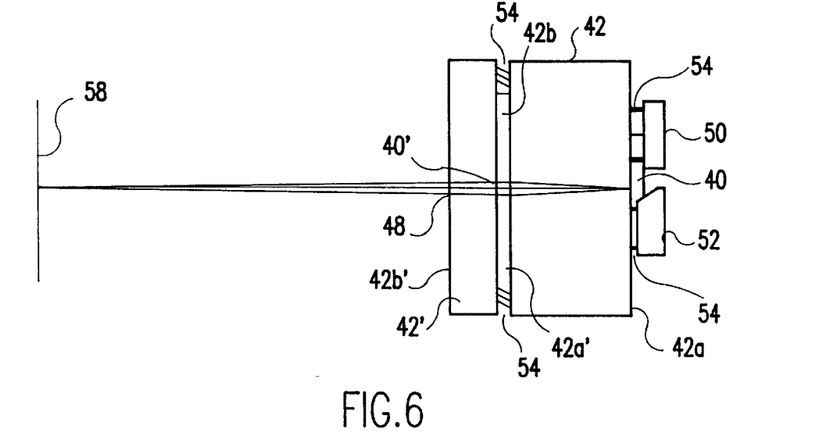
FIG. 6 is a side view of a configuration of the present invention employing more than one optical element substrate.

Further, since the mass production noted above is on a planar level, it is important that the laser have a flat profile. Use of an end or surface emitting laser die will result in such a configuration. However, when an edge emitting laser is used, it is conventionally mounted so that its emitting edge faces the optical element. This does not result in the desired flat profile. Therefore, as shown in the configurations in FIGS. 4a, 4b, and 5, in accordance with the present invention, a mirror is provided with an edge emitting laser in order to properly direct the light therefrom onto the optics, while allowing the profile to be flat.

Where divergence of the beam output from the laser 50 is more severe or desired beam shaping cannot be efficiently realized over a reasonable traversal distance, more than one substrate, containing additional DOEs for shaping may be employed. An example of such a configuration is shown in FIG. 6, in which an additional substrate 42' is added in the path of the beam. The substrate 42' is bonded to and aligned with the substrate 42 again using metalized pads 54. Alternatively, since no electrical connection is required to the elements provided on these substrates, a UV cured epoxy may be used both as the alignment features and to bond the substrates 42 and 42' to one another. A DOE 40' may be placed on the input surface 42a' and the collimator 48 is now provided on the output surface of the additional substrate 42b'. Another optical element may also be placed on the output surface 42b, where the collimator 48 was positioned in FIG. 5.

Figure 7:
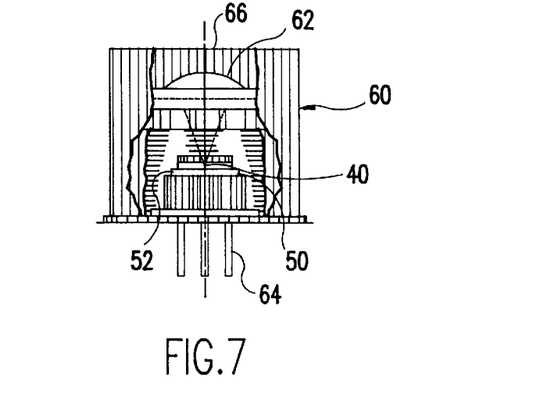
FIG. 7 is a fragmented elevational view of an integrated beam shaper of the present invention in a can with a light source.

By mounting the laser on a substrate using fiducial marks and/or alignment features, and creating the marks, the alignment features and the optical elements used to produce an appropriately shaped beam by photolithography, all of the elements of the system may be placed in a can 60 to protect them from environmental factors, as shown in FIG. 7. In FIG. 7, a collimating element 62, shown as a refractive element, is placed away from the substrate 42 to achieve the desired spot size output from the can 60. Leads 64 are for connecting the laser 52 in the can 60 to appropriate electronics. Use of such a can also allows for easy alignment with other systems into which the laser is to be incorporated.

Further, if such a can 60 is used, a transparent cap 66 placed on an end thereof may be used to perform additional beam modifications. For example, the collimating element may be incorporated thereon and other diffractive elements may be integrated thereon. The cap could be removable, to provide interchangeability thereof. Additionally, since the elements in the can have been precisely aligned, the cap 66 may include a reference thereon for aiding in the alignment of other parts which are external to the can 60.

If additional substrates are employed, for example, a substrate 56 to support the light source 50 and the mirror 52, or another substrate is required for satisfactory beam shaping, attachment areas for attaching the substrates to one another are provided on at least one of the adjacent faces of the substrates.

Conclusion

While many of the above configurations have been described and illustrated as having all the elements therein positioned immediately adjacent to one another, it will be apparent that all elements, whether substrates, heat sinks, or electrical elements, may be positioned with spacer blocks therebetween.

It is noted that if a refractive element is desired to be used as the collimating optical element 48, this refractive element may be created using photolithography. Creation of spherical refractive elements is known by melting a photoresist as taught in O. Wada, "Ion-Beam Etching of InP and it's Application to the Fabrication of High Radiance InGAsP/InP Light Emitting Diodes", General Electric Chemical Society, Solid State Science and Technology, Vol. 131, No. 10, October, 1984, pp. 2373–2380. Refractive elements of any shape may be made employing photolithographic techniques used for making DOEs, when the masks used therein are gray scale masks, such as high energy beam sensitive (HEBS) or absorptive gray scale masks, disclosed in Provisional Application Ser. No. 60/041,042 entitled "Gray Mask Made of Absorptive Materials and for Fabricating Optical Elements Using a Photoresist Formed from Contact Printing of a Gray Mask" filed on Apr. 11, 1997.

As will be apparent to those skilled in the art, the diffractives designed in accordance with the present invention may also be deep diffractives. Deep diffractives are diffractives in which the phase depth is greater than $2\pi$.

Further, as will be apparent to those skilled in the art, the diffractive optics of the present invention may be made by any known conventional methods, such as photolithography, diamond tuning, etc. The selection of the appropriate method will depend on the substrate material, the particulars of the design in accordance with the present invention, the intended application, degree of precision required, cost and time allocation, etc.

The invention being thus described, it would be obvious that the same may be varied in many ways. Such variations are not regarded as a departure from the spirit and scope of the invention, and such modifications as would be obvious to one skilled in the art are intended to be included within the scope of the following claims.

What is claimed is:

1. An integrated beam shaper comprising:
   a light source outputting a light beam;
   a transparent substrate mounted adjacent to said light source, said transparent substrate having first and second surfaces opposite to and spaced from one another; and
   first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis, and wherein said light source is mounted directly on said transparent substrate.

2. The integrated beam shaper according to claim 1, wherein said first optical element is on a first surface of said transparent substrate closest to said light source.

3. The integrated beam shaper according to claim 1, wherein said first optical element provides said light beam having a desired beam shape to said second optical element.

4. The integrated beam shaper according to claim 1, wherein said light beam output by said light source is elliptical and said first optical element reduces ellipticity of said light beam.

5. The integrated beam shaper according to claim 1, wherein said light beam output by said light source is elliptical and said first optical element provides a circular light beam to said second optical element, said circular light beam being substantially circular only in a vicinity of said second optical element.

6. The integrated beam shaper according to claim 1, wherein said transparent substrate is a single substrate.

7. The integrated beam shaper according to claim 1, wherein said light source is a light source die from a wafer containing a plurality of light sources.

8. The integrated beam shaper according to claim 1, wherein said light source is an edge emitting laser generating an elliptical beam and said first optical element circularizes said elliptical beam.

9. The integrated beam shaper according to claim 1, further comprising a mirror directing said light beam from said light source to said first optical element.

10. The integrated beam shaper according to claim 9, wherein at least one of said first and second optical elements includes a soft aperture.

11. The integrated beam shaper according to claim 1, wherein at least one of said first and second optical elements includes a soft aperture.

12. The integrated beam shaper according to claim 1, wherein said desired intensity distribution is at least one of a cross-hair, a circle, a rectangle, and a non-Gaussian intensity distribution.

13. The integrated beam shaper according to claim 1, wherein said desired intensity distribution is at least one of a flat-top, a pattern of multiple spots, and a grey-scale image.

14. The integrated beam shaper according to claim 1, wherein said light source includes a heat sink and a laser die mounted on said heat sink.

15. The integrated beam shaper according to claim 14, wherein said heat sink is longer than said transparent substrate.

16. The integrated beam shaper according to claim 1, further comprising a housing in which said transparent substrate and said light source are provided.

17. The integrated beam shaper according to claim 1, wherein the second optical element provides a predetermined phase pattern to said light beam.

18. The integrated beam shaper according to claim 17, wherein said second predetermined phase pattern provided by said second optical element focusses said desired predetermined intensity distribution at a set distance.

19. An integrated beam shaper comprising:
    a light source outputting a light beam;
    a transparent substrate mounted adjacent to said light source, said transparent substrate having first and second surfaces opposite to and spaced from one another;
    first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis; and
    spacer blocks mounted on a first surface thereof to said transparent substrate and on an opposite surface thereof to said light source.

20. An integrated beam shaper comprising:
    a light source outputting a light beam;
    a first transparent substrate mounted adjacent to said light source, said first transparent substrate having first and second surfaces opposite to and spaced from one another;
    a second transparent substrate bonded to said first transparent substrate; and
    first and second optical elements on respective first and second surfaces of the first transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis.

21. An integrated beam shaper comprising:
    a light source outputting a light beam;
    a transparent substrate mounted adjacent to said light source, said transparent substrate having first and second surfaces opposite to and spaced from one another;
    first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis;

a housing in which said transparent substrate and said light source are provided; and a third optical element providing a predetermined phase pattern to said light beam, said second optical element being mounted on said housing.

22. An integrated beam shaper comprising:

a light source outputting a light beam;

a transparent substrate mounted adjacent to said light source, said transparent substrate having first and second surfaces opposite to and spaced from one another; and first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis, wherein said light source is a light source die from a wafer containing a plurality of light sources and wherein said light source die is mounted on a wafer serving as said transparent substrate.

23. An integrated beam shaper comprising:

a light source outputting a light beam, said light source including a heat sink and a laser die mounted on said heat sink;

a transparent substrate mounted adjacent to said light source, said transparent substrate having first and second surfaces opposite to and spaced from one another; and first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis, wherein a plurality of said light sources are bonded to said heat sink and diced to from light source-heat sink dies prior to bonding with a wafer serving as said transparent substrate, said wafer containing a plurality of first optical elements, said wafer having said light source-heat sink dies bonded thereon being diced to form the integrated beam shaper.

24. The integrated beam shaper according to claim 23, wherein said plurality of said light sources include lithographically formed alignment marks thereon, said heat sink includes corresponding lithographically formed alignment marks thereon, and said wafer includes lithographically formed alignment marks thereon, said alignment marks being used during respective bonding for aligning portions being bonded.

25. An integrated beam shaper comprising:

a light source outputting a light beam, said light source including a heat sink and a laser die mounted on said heat sink;

a transparent substrate mounted adjacent to said light source, said transparent substrate having first and second surfaces opposite to and spaced from one another; and first and second optical elements on respective first and second surfaces of the transparent substrate, said first optical element receiving said light beam and said first and second optical elements shaping a beam output by said light source into a light beam having a desired intensity pattern, wherein both the first and the second optical elements shape light in a different manner and each shapes light along one axis in a different manner than along another axis, wherein a plurality of said first optical elements are on said transparent substrate and diced to form first optical element-substrate dies prior to bonding with a wafer serving as said heat sink, said wafer containing a plurality of light sources bonded theron, said wafer having said first optical element-substrate dies bonded thereon being diced to form the integrated beam shaper.

26. The integrated beam shaper according to claim 25, wherein said plurality of said light sources include lithographically formed alignment marks thereon, said heat sink includes corresponding lithographically formed alignment marks thereon, and said wafer includes lithographically formed alignment marks thereon, said alignment marks being used during respective bonding for aligning portions being bonded.

* * * * *